US 011476292B2

(12) United States Patent
Hsieh

(10) Patent No.: US 11,476,292 B2
(45) Date of Patent: *Oct. 18, 2022

(54) MULTI-CHIP PACKAGING STRUCTURE FOR AN IMAGE SENSOR

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 11 days.

This patent is subject to a terminal disclaimer.

(21) Appl. No.: 16/946,768

(22) Filed: Jul. 6, 2020

(65) Prior Publication Data

US 2020/0335544 A1 Oct. 22, 2020

Related U.S. Application Data

(63) Continuation of application No. 16/103,128, filed on Aug. 14, 2018, now Pat. No. 10,707,257.

(51) Int. Cl.
*H01L 27/146* (2006.01)
*H01L 23/31* (2006.01)
(Continued)

(52) U.S. Cl.
CPC .... *H01L 27/14634* (2013.01); *H01L 23/3128* (2013.01); *H01L 23/3135* (2013.01);
(Continued)

(58) Field of Classification Search
CPC .......... H01L 27/14634; H01L 23/3128; H01L 23/3135; H01L 23/49833; H01L 23/49838; H01L 24/16; H01L 24/48; H01L 27/14618; H01L 27/14636; H01L 27/1469; H01L 2224/16227; H01L 2224/48227
See application file for complete search history.

(56) References Cited

U.S. PATENT DOCUMENTS 10,707,257 B2 * 7/2020 Hsieh ............... H01L 23/49811
2006/0051892 A1 3/2006 Bolken et al.
(Continued)

*Primary Examiner* — Fernando L Toledo
*Assistant Examiner* — Neil R Prasad
(74) *Attorney, Agent, or Firm* — Brake Hughes Bellermann LLP

(57) ABSTRACT

According to an aspect, a multi-chip packaging structure includes a first substrate having a first surface and a second surface, where the first substrate has a conductive layer portion. The multi-chip packaging structure includes an image sensor device coupled to the first surface of the first substrate, a first device coupled to the second surface of the first substrate, and a second substrate disposed apart from the first substrate, where the second substrate has a conductive layer portion. The conductive layer portion of the first substrate is communicatively connected to the conductive layer portion of the second substrate. The first device is disposed between the first substrate and the second substrate. The multi-chip packaging structure includes a second device coupled to the second substrate, and a third device coupled to the first substrate or the second substrate.

23 Claims, 7 Drawing Sheets

(51) Int. Cl.
*H01L 23/00* (2006.01)
*H01L 23/498* (2006.01)
(52) U.S. Cl.
CPC .. *H01L 23/49833* (2013.01); *H01L 23/49838* (2013.01); *H01L 24/16* (2013.01); *H01L 24/48* (2013.01); *H01L 27/1469* (2013.01); *H01L 27/14618* (2013.01); *H01L 27/14636* (2013.01); *H01L 2224/16227* (2013.01); *H01L 2224/48227* (2013.01)

(56) References Cited

U.S. PATENT DOCUMENTS

| | | | |
|---|---|---|---|
| 2010/0310137 A1 | 12/2010 | Chou et al. | |
| 2012/0228754 A1* | 9/2012 | Liu | A61P 3/00 257/676 |
| 2013/0221470 A1 | 8/2013 | Kinsman et al. | |
| 2015/0091167 A1 | 4/2015 | Geissler et al. | |
| 2015/0140736 A1 | 5/2015 | Pendse | |
| 2016/0276307 A1* | 9/2016 | Lin | H01L 21/561 |
| 2016/0379961 A1 | 12/2016 | Lee et al. | |
| 2018/0138225 A1* | 5/2018 | Kim | H01L 27/14645 |
| 2018/0145104 A1 | 5/2018 | Kim et al. | |
| 2018/0204866 A1 | 7/2018 | Hsieh | |
| 2018/0301443 A1* | 10/2018 | Kim | H01L 23/3121 |

* cited by examiner

MULTI-CHIP PACKAGING STRUCTURE FOR AN IMAGE SENSOR

RELATED APPLICATION

This application is a continuation of and claims priority to application Ser. No. 16/103,128, filed Aug. 14, 2018, entitled "MULTI-CHIP PACKAGING STRUCTURE FOR AN IMAGE SENSOR", which is incorporated by reference in its entirety.

TECHNICAL FIELD

This description relates to a multi-chip packaging structure for an image sensor.

BACKGROUND

Integrated circuits (ICs) may require packaging to enclose chips and provide protection during shipping, assembly and subsequent use. In some packaging structures, IC devices are assembled on the backend of the printed circuit board (PCB) with relatively long traces interconnected with the image sensor.

SUMMARY

According to an aspect, a multi-chip packaging structure includes a first substrate having a first surface and a second surface, where the first substrate has a conductive layer portion. The multi-chip packaging structure includes an image sensor device coupled to the first surface of the first substrate, a first device coupled to the second surface of the first substrate, and a second substrate disposed apart from the first substrate, where the second substrate has a conductive layer portion. The conductive layer portion of the first substrate is communicatively connected to the conductive layer portion of the second substrate. The first device is disposed between the first substrate and the second substrate. The multi-chip packaging structure includes a second device coupled to the second substrate, and a third device coupled to the first substrate or the second substrate.

According to some aspects, the multi-chip packaging structure may include one or more of the following features (or any combination thereof). The second substrate may include a first surface and a second surface, and the second device is coupled to the first surface of the second substrate, and the third device is coupled to the first surface of the second substrate. The multi-chip packaging structure may include a plurality of conductive components coupled to the second surface of the second substrate, where the plurality of conductive components are configured to be connected to an external device. The multi-chip packaging structure may include a fourth device coupled to the second substrate. The multi-chip packaging structure may include one or more insulating layers disposed between the first substrate and the second substrate. The insulating layers may include a first insulating layer disposed on a first surface of the second substrate, a second insulating layer disposed on the first insulating layer, and a third insulating layer disposed between the second insulating layer and the second surface of the first substrate. The multi-chip packaging structure may include a transparent member coupled to the image sensor device such that an empty space exists between an active region of the image sensor device and the transparent member. The multi-chip packaging structure may include one or more bond wires coupled between the image sensor device and the first surface of the first substrate to communicatively connect the image sensor device to the first substrate. The multi-chip packaging structure may include a molding material encapsulating the one or more bond wires. The multi-chip packaging structure may include one or more vias coupled to and extending between the conductive layer portion of the first substrate and the conductive layer portion of the second substrate to communicatively connect the first substrate to the second substrate. The second device may be coupled to the second substrate with one or more bump members. The first device may be coupled to the first substrate with one or more vias.

According to an aspect, a multi-chip packaging structure includes a first substrate having a first surface and a second surface, an image sensor device coupled to the first surface of the first substrate, a image signal processor (ISP) integrated circuit (IC) die coupled to the second surface of the first substrate, a second substrate, where the second substrate is communicatively connected to the first substrate, at least one insulating layer disposed between the first substrate and the second substrate, and a plurality of devices coupled to the second substrate.

According to some aspects, the multi-chip packaging structure may include one or more of the above and/or below features (or any combination thereof). The plurality of devices may include a memory IC die, and a driver IC die. The at least one insulating layer may include a first insulating layer disposed on a first surface of the second substrate, a second insulating layer disposed on the first insulating layer, and a third insulating layer disposed between the second insulating layer and the first substrate. The multi-chip packaging structure may include one or more vias coupled to and extending between the first substrate and the second substrate to electrically connect the first substrate to the second substrate, the one or more vias extending through the at least one insulating layer. The multi-chip packaging structure may include one or more bond wires coupled between the ISP IC die and one or more conductive portions on the first substrate to electrically connect the ISP IC die to the first substrate. The multi-chip packaging structure may include a molding material encapsulating the one or more bond wires.

According to an aspect, a method of fabricating a multi-chip packaging structure includes coupling a first device and a second device to a first surface of a first substrate, disposing at least one first insulating layer on the first surface of the first substrate, coupling a third device to the at least one insulating layer, disposing a second insulating layer on the third device and the at least one first insulating layer, coupling a second substrate to the second insulating layer, and coupling an image sensor device to the second substrate. In some aspects, the method further includes forming an electrical connection between the first substrate and the second substrate.

The details of one or more implementations are set forth in the accompanying drawings and the description below. Other features will be apparent from the description and drawings, and from the claims.

DETAILED DESCRIPTION

The present disclosure relates to a multi-chip packaging structure for an image sensor that may reduce the size of the overall package while increasing the number devices included in this structure, reduce (or eliminate) noise on the image signal transferred from the image sensor to the devices, and/or reduce the cost for manufacturing such packages. In some examples, the multi-chip packaging structure may include an image sensor, and three or more devices coupled to a first substrate and a second substrate.

Figure 1A:
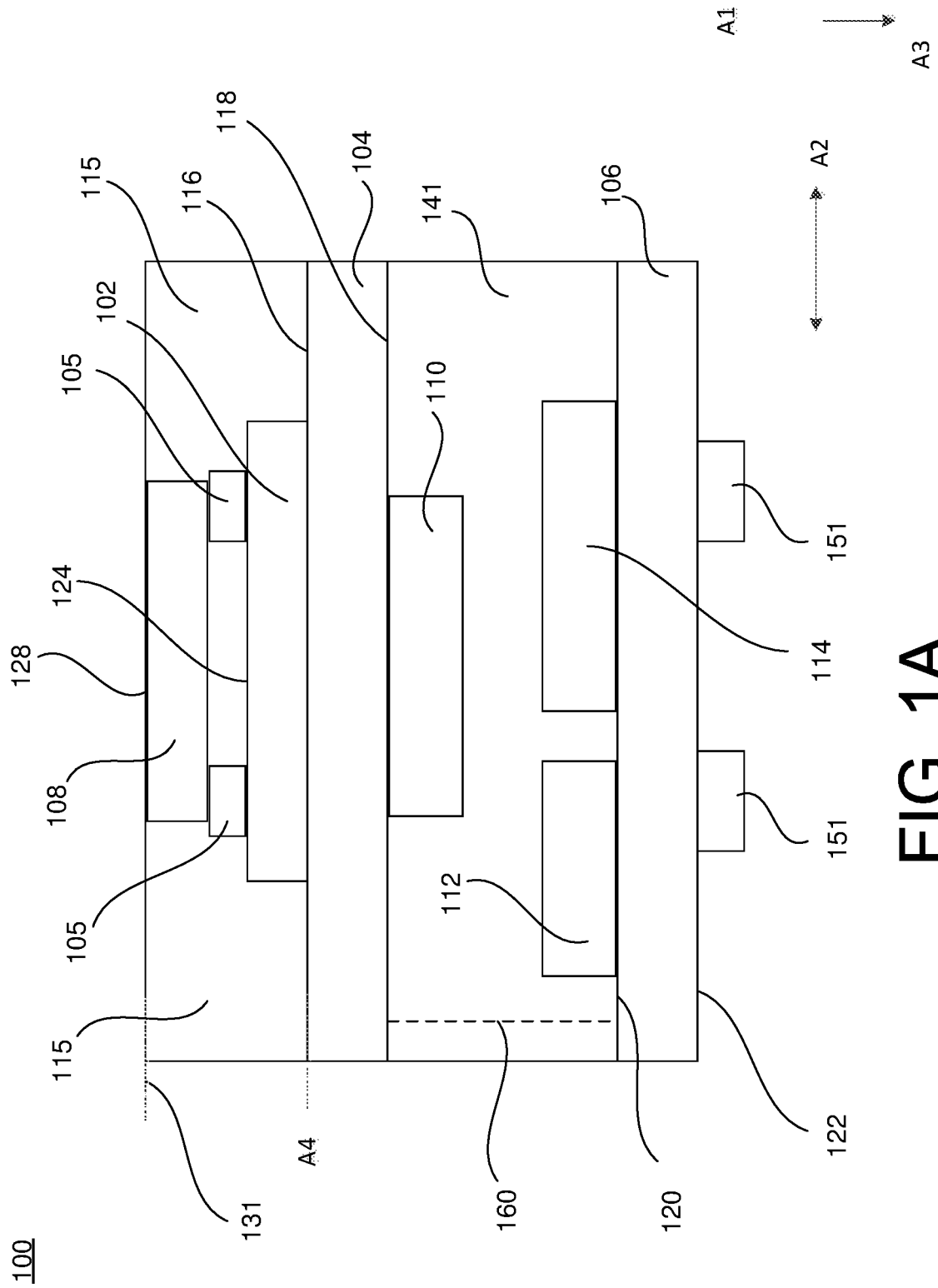
FIG. 1A illustrates a multi-chip packaging structure for an image sensor device according to an aspect.
Figure 1B:
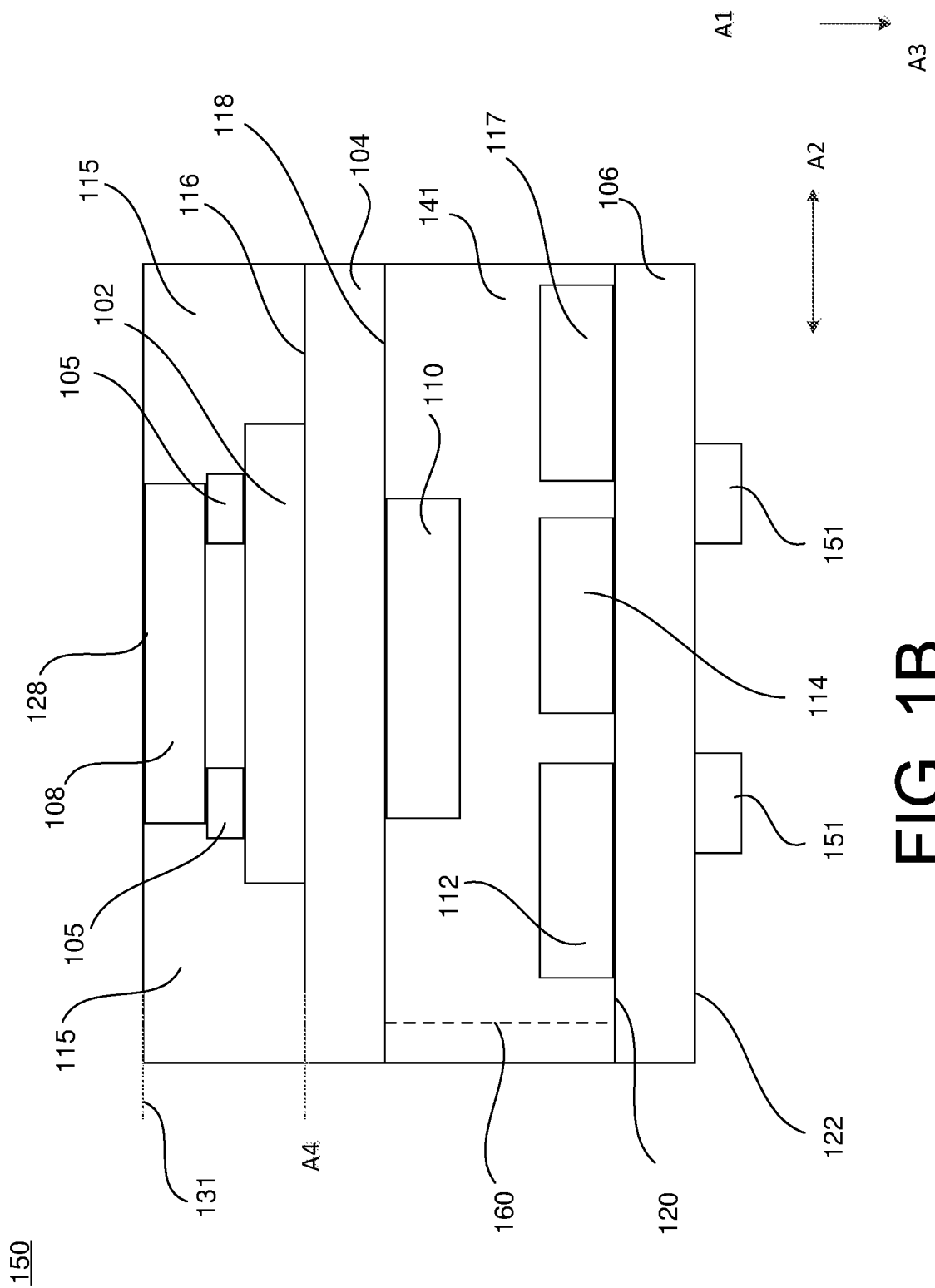
FIG. 1B illustrates a multi-chip packaging structure for an image sensor device according to another aspect.
Figure 1C:
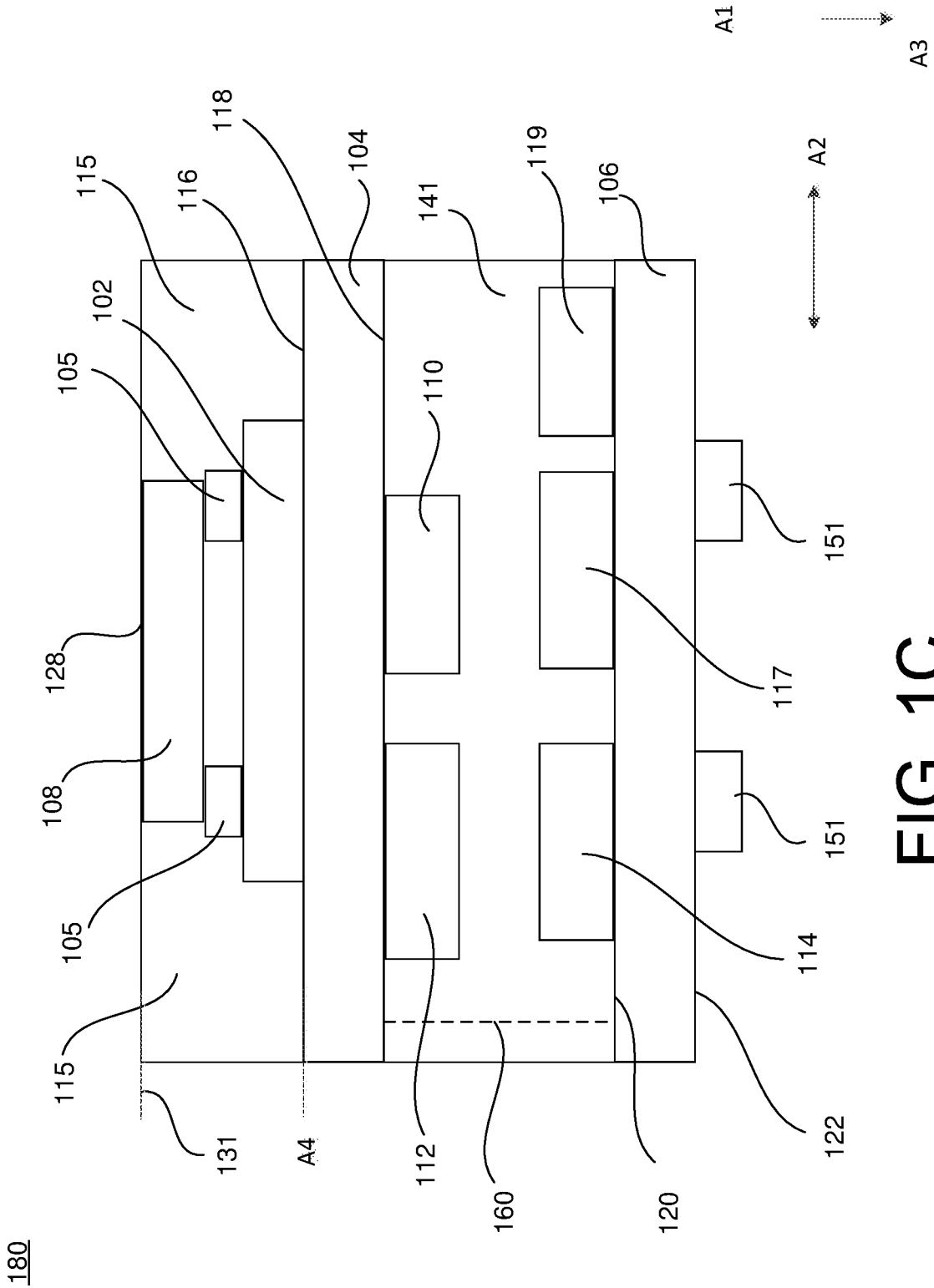
FIG. 1C illustrates a multi-chip packaging structure for an image sensor device according to another aspect.

FIGS. 1A through 1C illustrate various examples of a multi-chip packaging structure (e.g., 100, 150, 180) for an image sensor device 102. Referring to FIGS. 1A through 1C, the image sensor device 102 includes an image sensor die having an array of pixel elements configured to convert light into electrical signals. In some examples, the image sensor device 102 includes a complementary metal-oxide semiconductor (CMOS) image sensor. The multi-chip packaging structure 100 includes a transparent member 108 coupled to the image sensor device 102 such that the transparent member 108 is positioned over (and spaced apart from) a surface 124 of the image sensor device 102 in a direction A1. In some examples, the transparent member 108 includes a cover. In some examples, the transparent member 108 includes a lid. In some examples, the transparent member 108 includes a glass material. In some examples, the multi-chip packaging structure 100 includes dam members 105 that position the transparent member 108 away from the surface 124 of the image sensor device 102. In some examples, the dam members 105 include a bonding material. In some examples, the dam members 105 include an epoxy resin. In some examples, the dam members 105 include a glass dam. In some examples, the dam members 105 include a silicon dam. The dam members 105 are coupled to the transparent member 108 and to the image sensor device 102, where a portion of the surface 124 of the image sensor device 102 is disposed between adjacent dam members 105.

The multi-chip packaging structure 100 includes a first substrate 104. The first substrate 104 includes a printed circuit board (PCB) substrate. In some examples, the first substrate 104 includes a dielectric material. In some examples, the first substrate 104 includes a single layer of PCB base material. In some examples, the first substrate 104 includes multiple layers of PCB base material. In some examples, the first substrate 104 includes a copper clad laminate (CCL) substrate. The first substrate 104 includes a first (or top) surface 116 and a second (or bottom) surface 118. In some examples, the first substrate 104 includes one or more conductive layer portions (e.g., traces) disposed on the first surface 116 of the first substrate 104, and/or one or more conductive layer portions (e.g., traces) disposed on the second surface 118 of the first substrate 104. In some examples, the one or more conductive layer portions on the first substrate 104 include electrical traces. The electrical traces may be configured to and/or used to transmit signals to and/or from devices (e.g., electronic devices included in a semiconductor region (e.g., epitaxial layer and/or semiconductor substrate)) connected to the electrical traces. In some examples, the electrical traces can include conductive traces (e.g., metallic traces) such as copper traces, aluminum traces, and/or so forth. In some examples, the electrical traces include a relatively flat, narrow part of a copper foil that remains after etching. In some examples, the first substrate 104 is a CCL substrate with copper traces (on both surfaces) with a pre-preg core (e.g., pre-impregnated with resin), where the copper traces are formed by photolithography patterning from a copper foil.

As shown in FIG. 1A, the image sensor device 102 is coupled to the first surface 116 of the first substrate 104, and a first device 110 is coupled to the second surface 118 of the first substrate 104. In some examples, the image sensor device 102 is coupled directly to the first surface 116 of the first substrate 104. In some examples, the image sensor device 102 is communicatively connected to the first substrate 104 using one or more bond wires. In some examples, the image sensor device 102 is coupled to the first surface 116 of the first substrate 104 using solder, one or more bumps, pillars, vias, or other members that couple the image sensor device 102 to the first substrate 104. In some examples, the first device 110 is coupled to the second surface 118 of the first substrate 104 using one or more vias. In some examples, the first device 110 is coupled to the second surface 118 of the first substrate 104 using solder, one or more bumps, or pillars. In some examples, the first device 110 is directly coupled to the second surface 118 of the first substrate 104. In some examples, the first device 110 is coupled to the first substrate 104 in a flip-chip configuration.

In some examples, the first device 110 includes an integrated circuit die. In some examples, the first device 110 includes an image signal processor (ISP) integrated circuit (IC) die. In some examples, the first device 110 includes a memory IC die. In some examples, the first device 110 includes a driver IC die. In some examples, the first device 110 includes a resistor, inductor, and/or capacitor (RLC) passive circuit. In some examples, the first device 110 includes a radar IC die. The multi-chip packaging structure 100 includes a second substrate 106. The second substrate 106 includes a first (or top) surface 120 and a second (or bottom) surface 122. The second substrate 106 may be electrically connected to the first substrate 104 via a connection 160. In some examples, the connection 160 includes a via that extends between the first substrate 104 and the second substrate 106 to electrically connect the first substrate 104 to the second substrate 106. In some examples, the connection 160 includes one or more transmissions lines, wires, or other conductive materials. The multi-chip packaging structure 100 may include an insulating layer 141 disposed between the first substrate 104 and the second substrate 106. In some examples, the insulating layer 141 includes one or more insulating polymer layers. In some examples, the insulating layer 141 includes a first insulating layer, a second insulating layer, and a third insulating layer. In some examples, the connection 160 (e.g., one or more vias) may extend through the insulating layer 141 and be connected to the first substrate 104 and the second substrate 106.

The second substrate 106 includes a printed circuit board (PCB) substrate. In some examples, the second substrate 106 includes a dielectric material. In some examples, the second substrate 106 includes a single layer of PCB base material. In some examples, the second substrate 106 includes multiple layers of PCB base material. In some examples, the second substrate 106 includes a copper clad laminate (CCL) substrate. In some examples, the second substrate 106 includes one or more conductive layer portions (e.g., traces) disposed on the first surface 120 of the second substrate 106, and/or one or more conductive layer portions (e.g., traces) disposed on the second surface 122 of the second substrate 106. In some examples, the one or more conductive layer portions on the second substrate 106 include electrical traces that include any of the characteristics described herein. In some examples, the second substrate 106 is a CCL substrate with copper traces (on both surfaces) with a pre-preg core (e.g., pre-impregnated with resin), where the copper traces are formed by photolithography patterning from a copper foil.

In some examples, the first substrate 104 and the second substrate 106 include the same type of material (e.g., both are CCL substrates with double side copper traces). In some examples, the second substrate 106 includes a material different than a material of the first substrate 104. In some examples, the dimensions (e.g., length, width, thickness) of the second substrate 106 are the same as the dimensions of the first substrate 104. In some examples, at least one dimension (e.g., length, width, thickness) of the second substrate 106 is different than at least one dimension of the first substrate 104. The second surface 122 of the second substrate 106 is coupled to conductive components 151. In some examples, the conductive components 151 are surface-mount packaging elements. In some examples, the conductive components 151 include solder balls. The conductive components 151 are components used to connect to an external device (e.g., a ball grid array (BGA) device). However, the conductive components 151 may include other types of surface-mount packaging elements.

The multi-chip packaging structure 100 includes a second device 112, and a third device 114. In some examples, the multi-chip packaging structure 100 includes the second device 112 but not the third device 114. In some examples, the second device 112 includes a memory IC die. In some examples, the second device 112 includes a driver IC die. In some examples, the second device 112 includes an RLC passive circuit. In some examples, the second device 112 includes a radar IC die. In some examples, the third device 114 includes a memory IC die. In some examples, the third device 114 includes a driver IC die. In some examples, the third device 114 includes an RLC passive circuit. In some examples, the third device 114 includes a radar IC die. In some examples, the first device 110, the second device 112, and the third device 114 are different types of devices (e.g., the first device 110 is an ISP IC die, the second device 112 is a memory IC die, and the third device 114 is a driver IC die). In some examples, at least two of the first device 110, the second device 112, and the third device 114 are the same type of devices (e.g., at least two are memory ICs or driver ICs, etc.).

The second device 112 is coupled to the first surface 120 of the second substrate 106, and the third device 114 is coupled to the first surface 120 of the second substrate 106. In some examples, the second device 112 is coupled to the second substrate 106 via bump members (e.g., bumps, pillars, etc.). In some examples, an under-fill material is disposed between the second device 112 and the first surface 120 of the second substrate 106 (e.g., between and around the bump members). In some examples, the under-fill material includes an insulation layer. In some examples, the under-fill material includes an epoxy-based material. In some examples, the under-fill material includes an epoxy dry film (e.g., b-stage resin film), where the under-fill material is applied by lamination (e.g., heat and press). In some examples, the second device 112 is coupled to the second substrate 106 using one or more vias. In some examples, the second device 112 is directly coupled to the second substrate 106. In some examples, the second device 112 is communicatively connected to the second substrate 106 using one or more bond wires.

In some examples, the third device 114 is coupled to the second substrate 106 via bump members (e.g., bumps, pillars, etc.). In some examples, an under-fill material is disposed between the third device 114 and the first surface 120 of the second substrate 106 (e.g., between and around the bump members). The under-fill material may be any of the above-described types of under-fill material. In some examples, the third device 114 is coupled to the second substrate 106 using one or more vias. In some examples, the third device 114 is directly coupled to the second substrate 106. In some examples, the third device 114 is communicatively coupled to the second substrate 106 using one or more bond wires.

The multi-chip packaging structure 100 includes a molding 115. The molding 115 may include one or more types of material (e.g., in a molding compound if including multiple types of materials) such as a metal, a plastic, a resin, an epoxy, a phenolic hardener, a silica material, a pigment, a glass, a ceramic casing, and/or so forth. The molding 115 may be disposed on portions of the first surface 116 of the first substrate 104 and extend to a plane 131 aligned with a top surface 128 of the transparent member 108. In some examples, the plane 131 is disposed below (or above) the surface 128 (in a direction A1).

As discussed herein, the terms top and bottom refer to the relative location of the corresponding component when the multi-chip packaging structure (e.g., 100, 150, 180, 200) is within an orientation. The image sensor device 102 is disposed on a plane A4 that is substantially aligned with the first surface 116 of the first substrate 104. A direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

FIG. 1B illustrates a multi-chip packaging structure 150 according to another aspect. The multi-chip packaging structure 150 may include any one or more of the components discussed with reference to FIG. 1A. The multi-chip packaging structure 150 includes four devices in addition to the image sensor device 102. For example, the multi-chip packaging structure 150 may include a fourth device 117 coupled to the first surface 120 of the second substrate 106. In some examples, the fourth device 117 includes an RLC passive circuit. In some examples, the fourth device 117 includes an IC die. In some examples, the fourth device 117 includes a memory IC die. In some examples, the fourth device 117 includes a driver IC die. In some examples, the fourth device 117 includes a radar IC die. In some examples, the multi-chip packaging structure 150 includes more than four devices such as a fifth device coupled to the second surface 118 of the first substrate 104, and a sixth device coupled to the first surface 120 of the second substrate 106.

FIG. 1C illustrates a multi-chip packaging structure 180 according to another aspect. The multi-chip packaging structure 180 may include any of the components discussed with reference to FIGS. 1A and 1C. The multi-chip packaging structure 180 includes five devices in addition to the image sensor device 102. For example, the multi-chip packaging structure 180 may include a fifth device 119. The first device 110 may be coupled to the second surface 118 of the first substrate 104, the second device 112 may be coupled to the second surface 118 of the first substrate 104, the third device 114 may be coupled to the first surface 120 of the second substrate 106, the fourth device 117 may be coupled to the first surface 120 of the second substrate 106, and the fifth device 119 may be coupled to the coupled to the first surface 120 of the second substrate 106. In some examples, the fifth device 119 includes an RLC passive circuit. In some examples, the fifth device 119 includes an IC die. In some examples, the fifth device 119 includes a memory IC die. In some examples, the fifth device 119 includes a driver IC die. In some examples, the fifth device 119 includes a radar IC die. In some examples, the multi-chip packaging structure 180 includes more than five devices such as a sixth device coupled to the second surface 118 of the first substrate 104, and a seventh device coupled to the first surface 120 of the second substrate 106.

Figure 2:
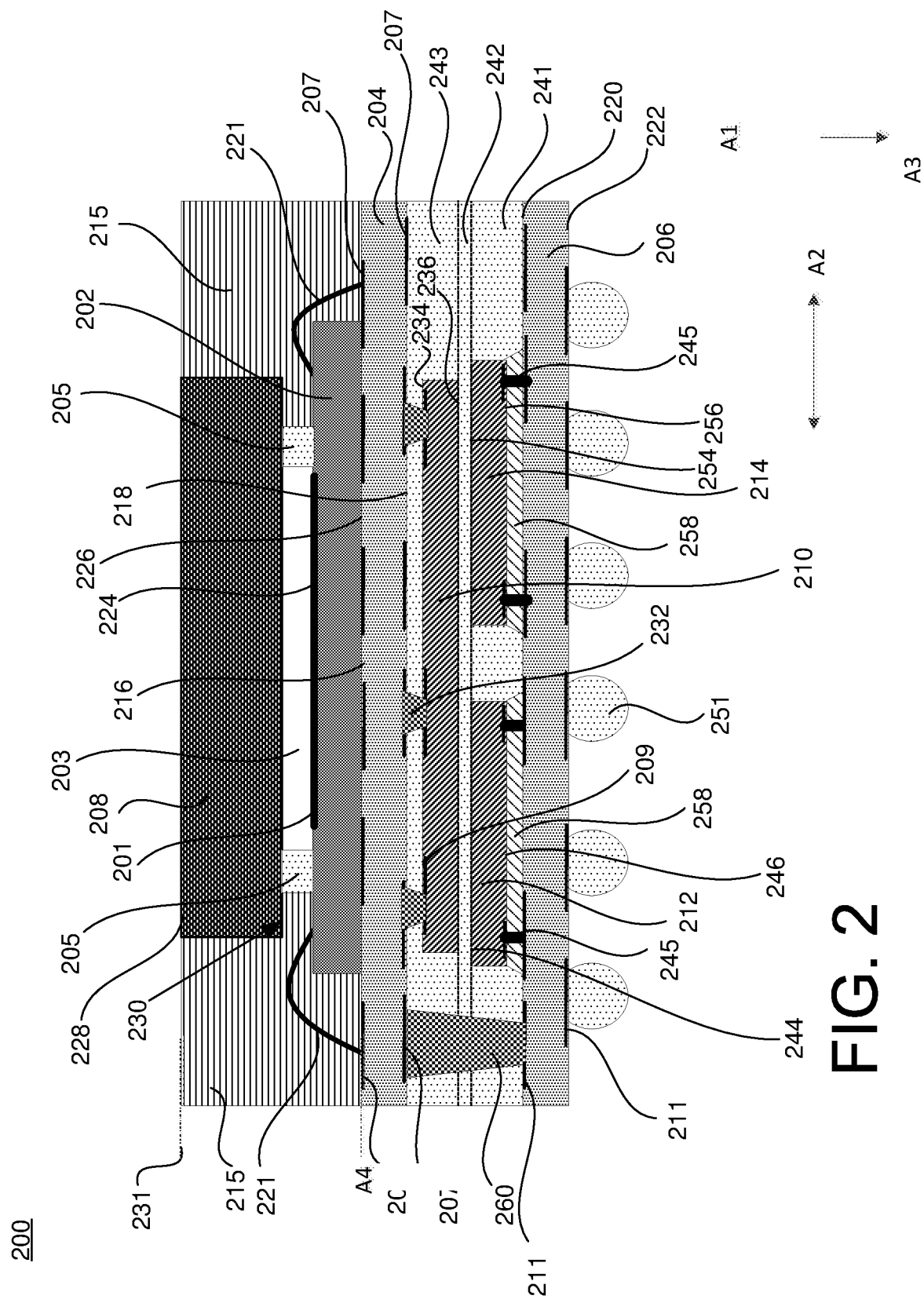
FIG. 2 illustrates a multi-chip packaging structure for an image sensor device according to another aspect.

FIG. 2 illustrates a multi-chip packaging structure 200 for an image sensor device 202 according to an aspect. The multi-chip packaging structure 200 may include any of the features discussed with reference to FIGS. 1A through 1C. The image sensor device 202 includes an image sensor die having an array of pixel elements configured to convert light into electrical signals. In some examples, the image sensor device 202 includes a complementary metal-oxide semiconductor (CMOS) image sensor. The image sensor device 202 has a first (or top) surface 224 and a second (or bottom) surface 226. The first surface 224 defines an active region 201 of the image sensor device 202. The active region 201 includes a pixel area (e.g., the pixel array) configured to receive light.

The multi-chip packaging structure 200 includes a transparent member 208 coupled to the image sensor device 202 such that the transparent member 208 is positioned over (and spaced apart from) the active region 201 of the image sensor device 202. In some examples, the transparent member 208 includes a cover. In some examples, the transparent member 208 includes a lid. In some examples, the transparent member 208 includes a glass material. The transparent member 208 includes a first (or top) surface 228, and a second (or bottom) surface 230. The transparent member 208 is positioned away from the image sensor device 202 in a direction A1 such that a space 203 (e.g., empty space) exists between the second surface 230 of the transparent member 208 and the first surface 224 of the image sensor device 202. In some examples, the multi-chip packaging structure 200 includes dam members 205 that position the transparent member 208 away from the active region 201 of the image sensor device 202. For example, the dam members 205 are coupled to the second surface 230 of the transparent member 208 and to the first surface 224 of the image sensor device 202 (at areas apart from the active region 201), where the active region 201 is disposed between adjacent dam members 205. In some examples, the dam members 205 include a bonding material. In some examples, the dam members 205 include an epoxy resin. In some examples, the dam members 205 include a glass dam. In some examples, the dam members 205 include a silicon dam.

The multi-chip packaging structure 200 includes a first substrate 204. The first substrate 204 includes a printed circuit board (PCB) substrate. In some examples, the first substrate 204 includes a dielectric material. In some examples, the first substrate 204 includes a single layer of PCB base material. In some examples, the first substrate 204 includes multiple layers of PCB base material. In some examples, the first substrate 204 includes a copper clad laminate (CCL) substrate. The first substrate 204 includes a first (or top) surface 216 and a second (or bottom) surface 218. The first surface 216 of the first substrate 204 is coupled to the image sensor device 202, and the second surface 218 of the first substrate 204 is coupled to a first device 210 using one or more vias 232. For example, the second surface 226 of the image sensor device 202 is coupled to the first surface 216 of the first substrate 204. One or more conductive layer portions 207 are disposed on the first surface 216 of the first substrate 204, and one or more conductive layer portions 207 are disposed on the second surface 218 of the first substrate 204. In some examples, the conductive layer portions 207 include electrical traces (e.g., copper metal traces). The electrical traces may be configured to transmit signals to and/or from devices connected to the electrical traces and can include any of the characteristics described herein. In some examples, the first substrate 204 includes a CCL substrate with conductive (e.g., copper) traces (on both surfaces) with a pre-preg core (e.g., pre-impregnated with resin), where the conductive (e.g., copper) traces are formed by photolithography patterning from a conductive (e.g., copper) foil.

The first device 210 may include an IC die. In some examples, the first device 210 includes an ISP IC die. In some examples, the first device 210 includes a memory IC die. In some examples, the first device 210 includes a driver IC die. In some examples, the first device 210 includes an RLC passive circuit. In some examples, the first device 210 includes a radar IC die. The first device 210 includes a first (or top) surface 234 and a second (or bottom) surface 236. In some examples, the first surface 234 of the first device 210 includes one or more conductive layer portions 209 (e.g., traces). First ends of the vias 232 are connected to conductive layer portions 207 on the second surface 218 of the first substrate 204, and second ends of the vias 232 are connected to conductive layer portions 209 on the first surface 234 of the first device 210. Each via 232 is a vertical interconnect access that extends in the A1 direction between the first device 210 and the first substrate 204. Each via 232 may include a hole lined with a conductive material such as a tube or a rivet. In some examples, each via 232 may include a conductive tube disposed within the hole. Each via 232 may extend through a portion of the thickness of a third insulating layer 243.

The multi-chip packaging structure 200 includes bond wires 221 that connect the image sensor device 202 to the first substrate 204. In some examples, first ends of the bond wires 221 are connected to the first surface 224 of the image sensor device 202, and second ends of the bond wires 221 are connected to the conductive layer portions 207 on the first surface 216 of the first substrate 204. The bond wires 221 may be conductive (e.g., metal) wires such as aluminum, copper, or gold, or any combination thereof, for example.

The multi-chip packaging structure 200 includes a molding 215. The molding 215 may include one or more types of material (e.g., in a molding compound if including multiple types of materials) such as a metal, a plastic, a resin, an epoxy, a phenolic hardener, a silica material, a pigment, a glass, a ceramic casing, and/or so forth. The molding 215 may be disposed on portions of the first surface 216 of the first substrate 204 and extend to a plane 231 substantially aligned with the first surface 228 of the transparent member 208. In some examples, the molding 215 is disposed along the edges of the image sensor device 202, edges of the dam members 205, and edges of the transparent member 208. In some examples, the top surface of the molding 215 is disposed below (or above) the first surface 228 of the transparent member 208.

The multi-chip packaging structure 200 includes a second substrate 206. The second substrate 206 includes a first (or top) surface 220 and a second (or bottom) surface 222. The second substrate 206 includes a printed circuit board (PCB) substrate. In some examples, the second substrate 206 includes a dielectric material. In some examples, the second substrate 206 includes a single layer of PCB base material. In some examples, the second substrate 206 includes multiple layers of PCB base material. In some examples, the second substrate 206 includes a copper clad laminate (CCL) substrate. In some examples, the first substrate 204 and the second substrate 206 includes the same type of material (e.g., both are CCL substrates with double-sided copper traces). In some examples, the second substrate 206 includes a material different than a material of the first substrate 204. In some examples, the dimensions (e.g., length, width, thickness) of the second substrate 206 are the same as the dimensions of the first substrate 204. In some examples, at least one dimension of the second substrate 206 is different than at least one dimension of the first substrate 204. One or more conductive layer portions 211 are disposed on the first surface 220 of the second substrate 206, and one or more conductive layer portions 211 are disposed on the second surface 222 of the second substrate 206. In some examples, the conductive layer portions 211 include metal (e.g.) foil portions. In some examples, the conductive layer portions 211 include electrical traces. The electrical traces may be configured to transmit signals to and from devices connected to the electrical traces and can include any of the characteristics described herein. In some examples, the second substrate 206 includes a CCL substrate with conductive (e.g., copper) traces (on both surfaces) with a pre-preg core (e.g., pre-impregnated with resin), where the conductive traces are formed by photolithography patterning from a conductive foil.

The second substrate 206 is coupled to conductive components 251. For example, the second surface 222 of the second substrate 206 is coupled to the conductive components 251. In some examples, the conductive components 251 are surface-mount packaging elements. In some examples, the conductive components 251 include solder balls. The conductive components 251 are components used to connect to an external device (e.g., a ball grid array (BGA) device). However, the conductive components 251 may include other types of surface-mount packaging elements.

The multi-chip packaging structure 200 includes a second device 212, and a third device 214. In some examples, the second device 212 includes an IC die. In some examples, the second device 212 includes a memory IC die. In some examples, the second device 212 includes a driver IC die. In some examples, the second device 212 includes an ISP die. In some examples, the second device 212 includes a radar IC die. In some examples, the second device 212 includes an RLC passive circuit. In some examples, the third device 214 includes an IC die. In some examples, the third device 214 includes a driver IC die. In some examples, the third device 214 includes a memory IC die. In some examples, the third device 214 includes an ISP die. In some examples, the third device 214 includes an RLC passive circuit. In some examples, the third device 214 includes a radar IC die.

The second device 212 is coupled to the second substrate 206. The third device 214 is coupled to the second substrate 206. The second device 212 includes a first (or top) surface 244, and a second (or bottom) surface 246. The third device 214 includes a first (or top) surface 254, and a second (or bottom) surface 256. The second device 212 is coupled to the second substrate 206 via bump members 245, and the third device 214 is coupled to the second substrate 206 via bump members 245. In some examples, the bump members 245 include pillars. In some examples, the bump members 245 include copper pillars with solder, gold plated bumps, solder bumps, and/or gold stud bumps. The bump members 245 position the second surface 246 of the second device 212 away from the first surface 220 of the second substrate 206, and position the second surface 256 of the third device 214 away from the first surface 220 of the second substrate 206. The bump members 245 are connected some of the conductive layer portions 211 on the first surface 220 of the second substrate 206. Also, in order to assist with securing the second device 212 and the third device 214 to the second substrate 206, an under-fill material 258 is disposed between the second device 212 and the second substrate 206 and between the third device 214 and the second substrate 206. In some examples, the under-fill material 258 encapsulates portions of the bump members 245. The under-fill material 258 may extend between the second surface 246 of the second device 212 and the first surface 220 of the second substrate 206, and may extend between the second surface 256 of the third device 214 and the first surface 220 of the second substrate 206. In some examples, the under-fill material 258 includes an insulation layer. In some examples, the under-fill material 258 includes an epoxy-based material. In some examples, the under-fill material 258 includes an epoxy dry film (e.g., b-stage resin film), where the under-fill material 258 is applied by lamination (e.g., heat and press). The multi-chip packaging structure 200 includes one or more vias 260 configured to electrically connect the first substrate 204 to the second substrate 206.

The multi-chip packaging structure 200 includes one or more insulating layers disposed between the first substrate 204 and the second substrate 206 such as a first insulating layer 241, a second insulating layer 242, and a third insulating layer 243. The first insulating layer 241 may be disposed on the first surface 220 of the second substrate 206, and have a thickness (e.g. along the direction A1) such that the top surface of the first insulating layer 241 may be substantially aligned with the first surface 244 of the second device 212 and/or the first surface 254 of the third device 214. In some examples, the first insulating layer 241 extends above the first surface 244 of the second device 212 and extends above the first surface 254 of the third device 214. The first insulating layer 241 may encapsulate the first device 210, the second device 212, and a portion of the via 260.

The second insulating layer 242 may be disposed on the top surface of the first insulating layer 241 and may extend to the second surface 236 of the first device 210. In some examples, the thickness of the second insulating layer 242 may be less than the thickness of the first insulating layer 241. The second insulating layer 242 may encapsulate another portion of the via 260. The third insulating layer 243 may be disposed on the top surface of the second insulating layer 242, and may extend to the second surface 218 of the first substrate 204. In some examples, the thickness of the third insulating layer 243 is greater than the thickness of the second insulating layer 242. The third insulating layer 243 may encapsulate the first device 210, the vias 232, and a portion of the via 260. The via 260 may extend through the first insulating layer 241, the second insulating layer 242, and the third insulating layer 243. The vias 232 extend through a portion of the thickness of the third insulating layer 243. In some examples, each of the first insulating layer 241, the second insulating layer 242, and the third insulating layer 243 includes a polymer insulating layer. In some examples, the material of the first insulating layer 241, the material of the second insulating layer 242, and the material of the third insulating layer 243 is the same. In some examples, at least one of the materials from one or more these layers is different from other layers.

Figure 3A:
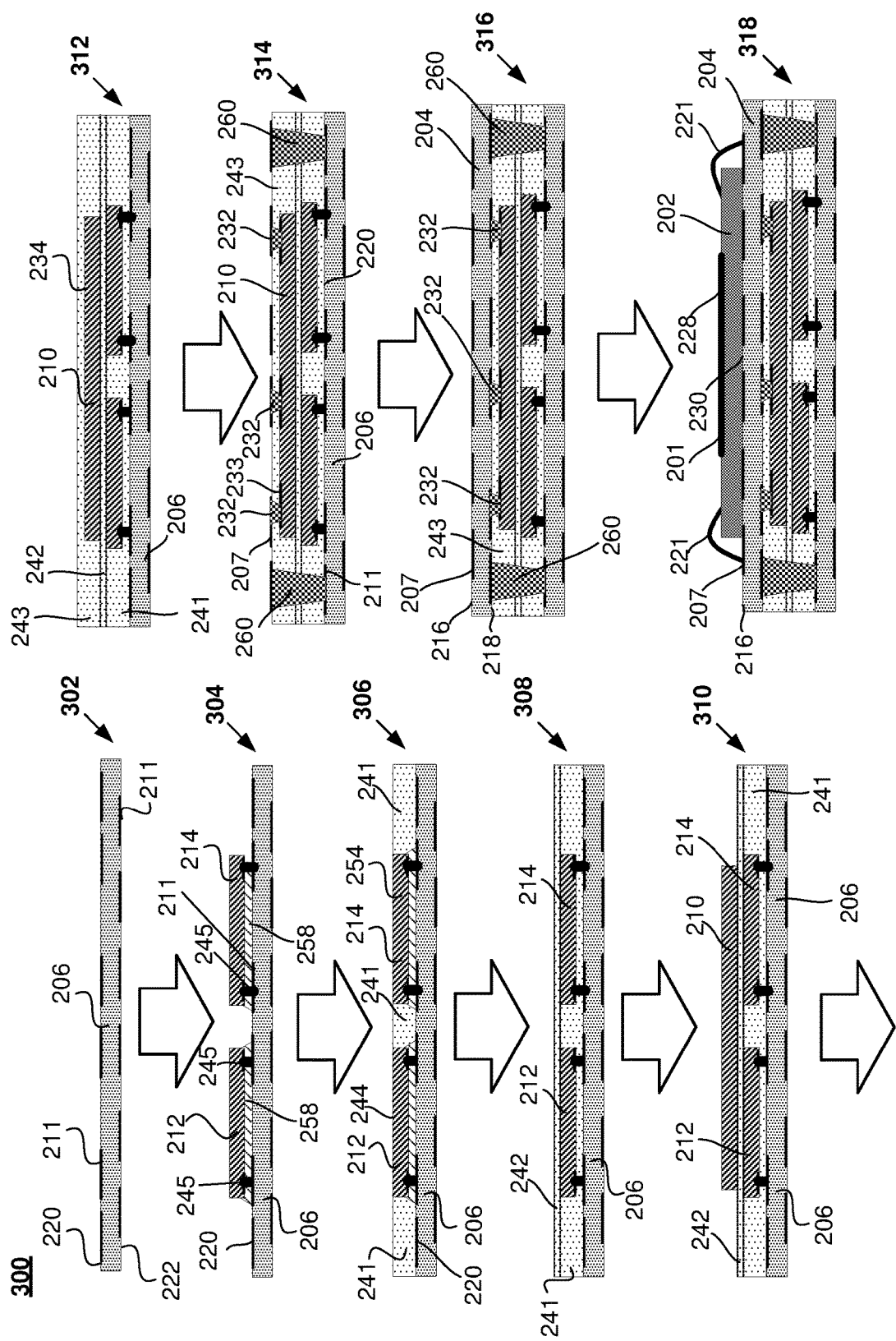
FIG. 3A illustrates a flowchart depicting example operations for assembling a multi-chip packaging structure for an image sensor device according to an aspect.
Figure 3B:
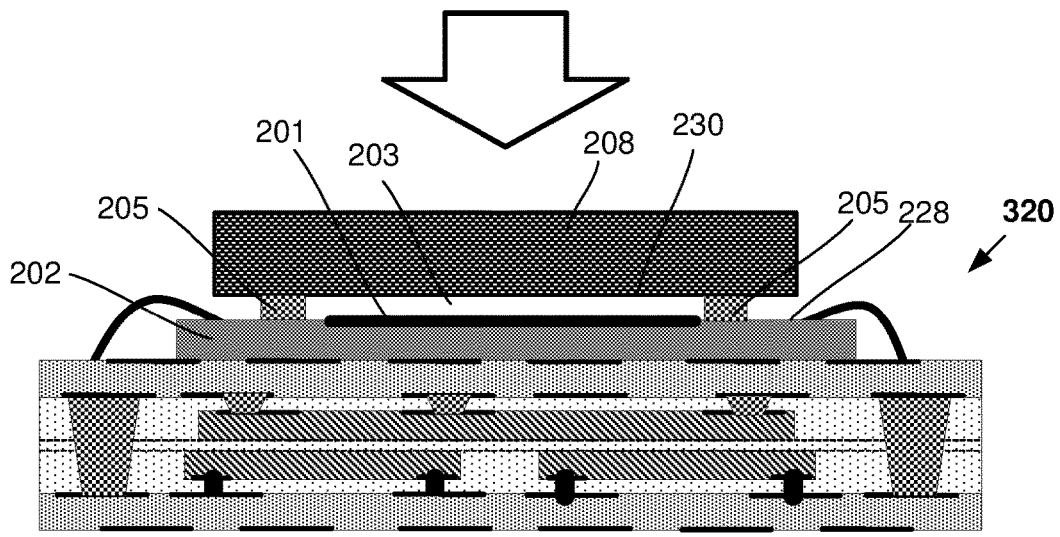
FIG. 3B illustrates a continuation of the flowchart of FIG. 3A according to an aspect.
Figure 3B:
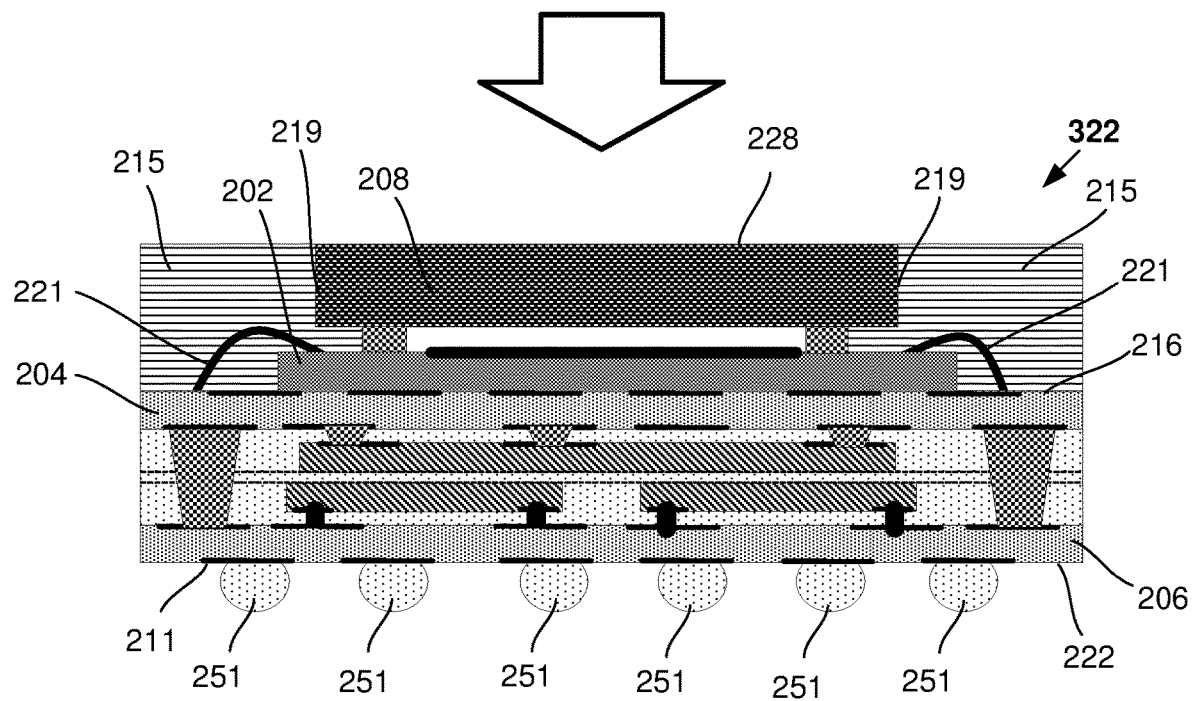

FIGS. 3A and 3B depict a process 300 with example fabrication operations for assembling the multi-chip packaging structure 200 of FIG. 2 according to an aspect.

In operation 302, the second substrate 206 is provided. In some examples, the second substrate 206 includes a copper clad laminate (CCL) substrate with conductive layer portions 211 disposed on the first surface 220 of the second substrate 206 and on the second surface 222 of the second substrate 206. In some examples, the second substrate 206 is a CCL with double side copper trace with pre-preg core (e.g., pre-impregnated with resin). The copper trace is made by photolithography patterning from a copper foil.

In operation 304, the second device 212 is coupled to the first surface 220 of the second substrate 206, and the third device 214 is coupled to the first surface 220 of the second substrate 206. In some examples, the second device 212 and the third device 214 is coupled to the second substrate 206 using the bump members 245 in a flip-chip configuration. For example, the bump members 245 are coupled to the second device 212 and the third device 214, and the bump members 245 are coupled to the conductive layer portions 211 on the first surface 220 of the second substrate 206. In some examples, the bump members 245 include copper pillars with solder, gold plated bumps, solder bump, and/or or copper stud bumps. In some examples, the second device 212 and/or the third device 214 is/are coupled to the second substrate 206 by surface mount technology (SMT) in which the second device 212 and/or the third device 214 are directly coupled to the second substrate 206. In some example, the under-fill material 258 is disposed between the second device 212 and the second substrate 206 to fill the gap, and the under-fill material 258 is disposed between the third device 214 and the second substrate 206 to fill the gap, thereby increasing the reliability of the multi-chip packaging structure 200.

In operation 306, the first insulating layer 241 is disposed (e.g., laminated) on the first surface 220 of the second substrate 206. In some examples, the first insulating layer 241 has a thickness that extends from the first surface 220 of the second substrate 206 to the first surface 244 of the second device 212 and/or the first surface 254 of the third device 214. In some examples, the first insulating layer 241 extends beyond the first surface 244 of the second device 212 and/or the first surface 254 of the third device 214. In some examples, the first insulating layer 241 includes a polymer type insulating layer. In some examples, the first insulating layer 241 includes a dry film type adhesive. In some examples, the top surface of the first insulating layer 241 is compression processed to render the top surface of the first insulating layer 241 relatively flat. Then, in some examples, the first insulating layer 241 is post-thermally cured to fully cure the first insulating layer 241.

In operation 308, the second insulating layer 242 is disposed (e.g., laminated) on the top surface of the first insulating layer 241. In operation 310, the first device 210 is disposed on the top surface of the second insulating layer 242. In some examples, the first device 210 is attached to the second insulating layer 242, where the second insulating layer 242 is not fully cured, and then thermal curing is performed to fully cure the second insulating layer 242.

In operation 312, the third insulating layer 243 is disposed (e.g., laminated) on the first surface 234 of the first device 210 and the top surface of the second insulating layer 242, and a thermal compression process is performed to render the top surface of the second insulating layer 242 relatively flat. In some examples, the third insulating layer 243 may have a thickness that extends from the top surface of the second insulating layer 242 to a plane above the first surface 234 of the first device 210.

In operation 314, the conductive layer portions 207 (e.g., copper foil portions) are attached to the top surface of the third insulating layer 243, and then thermal curing is performed to fully cure the third insulating layer 243. The conductive layer portions 207 may be patterned by lithography and an etching process to become electrical traces. The vias 260 may be formed through the first insulating layer 241, the second insulating layer 242, and the third insulating layer 243 in order to connect some of the conductive layer portions 207 to some of the conductive layer portions 211 on the first surface 220 of the second substrate 206. The vias 232 may be formed through a portion of the third insulating layer 243 in order to connect some of the conductive layer portions 207 to the pads 233 of the first device 210. The vias 260 and the vias 232 may be formed by laser drilling, sand blasting, and/or photo-etching, which can be followed by platting (e.g., copper plating).

In operation 316, the first substrate 204 is coupled to the third insulating layer 243, the vias 260, and the vias 232. In some examples, the first substrate 204 includes a copper clad laminate (CCL) substrate with conductive layer portions 207 disposed on the first surface 216 of the first substrate 204 and on the second surface 218 of the first substrate 204. In some examples, the first substrate 204 is a CCL with double side copper trace with pre-preg core (e.g., pre-impregnated with resin). The trace is made by photolithography patterning from a copper foil.

In operation 318, the image sensor device 202 is coupled to the first substrate 204. For example, the second surface 230 of the image sensor device 202 is coupled to the first surface 216 of the first substrate 204. The active region 201 is defined on the first surface 228 of the image sensor device 202. The bond wires 221 are coupled to the image sensor device 202 and to conductive layer portions 207 on the first surface 216 of the first substrate 204.

In operation 320, the transparent member 208 is coupled to the image sensor device 202 using the dam members 205 such that a space 203 exists between the active region 201 and the second surface 230 of the transparent member 208. For example, the dam members 205 produce a standoff and also function as an adhesive for attaching the transparent member 208.

In operation 322, a molding (or encapsulation) process is performed to cover the bond wires 221 and the edges 219 of the transparent member 208 with the molding 215. The molding 215 may be disposed on portions of the first surface 216 of the first substrate 204 and extend to a plane aligned with the first surface 228 of the image sensor device 202. Also, the conductive components 251 are attached to the second surface 222 of the second substrate 206. In some examples, the conductive components 251 are solder balls, where the solder balls are pin outs with a ball grid array (BGA) arrangement.

Figure 4:
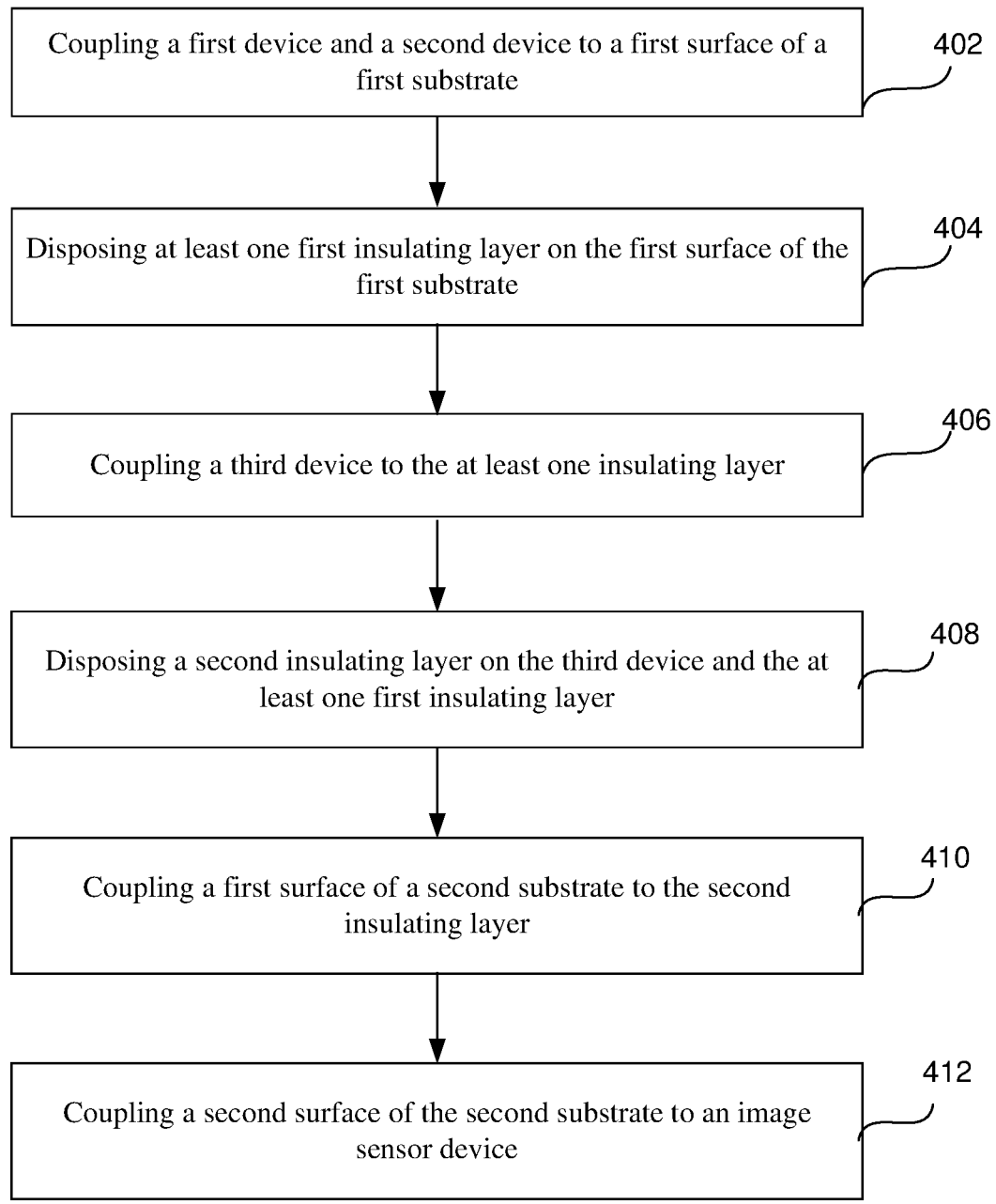
FIG. 4 illustrates a flowchart depicting example operations for assembling a multi-chip packaging structure for an image sensor device according to another aspect.

FIG. 4 illustrates a flowchart 400 depicting example assembly operations of the multi-chip packing structure (e.g., 100, 150, 180, 200) according to an aspect. Although the flowchart 400 of FIG. 4 illustrates operations in sequential order, it will be appreciated that this is merely an example, and that additional or alternative operations may be included. Further, operations of FIG. 4 and related operations may be executed in a different order than that shown, or in a parallel or overlapping fashion.

Operation 402 includes coupling a first device to a first surface of a first substrate. Operation 404 includes disposing at least one first insulating layer on the first substrate of the first substrate. Operation 406 includes coupling a third device to the at least one insulating layer. Operation 408 includes disposing a second insulating layer on the third device and the at least one first insulating layer. Operation 410 includes coupling a first surface of a second substrate to the second insulating layer. Operation 412 includes coupling a second surface of the second substrate to an image sensor device.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An image sensor package comprising:
    a first interposer having a first surface and a second surface, the first interposer including conductive traces on the first and second surfaces;
    an image sensor device coupled to at least one of the conductive traces on the first surface of the first interposer, the first interposer being disposed outside of an outer structure of the image sensor device;
    at least one conductive element coupled to the first interposer and the image sensor device;
    a first device coupled to at least one of the conductive traces on the second surface of the first interposer;
    a second interposer having a first surface and a second surface, the second interposer including conductive traces on the first and second surfaces of the second interposer, the first device being disposed between the first interposer and the second interposer; and
    a conductive via coupled to and between the first interposer and the second interposer.

2. The image sensor package of claim 1, further comprising:
    an insulation layer disposed between the first interposer and the second interposer.

3. The image sensor package of claim 2, wherein the insulation layer includes a polymer-based material.

4. The image sensor package of claim 2, wherein the insulation layer includes a first material and a second material, the second material being different than the first material.

5. The image sensor package of claim 2, wherein the conductive via extends through the insulation layer.

6. The image sensor package of claim 1, wherein the first interposer includes a copper clad laminate (CCL) substrate.

7. The image sensor package of claim 1, wherein the second interposer includes a copper clad laminate (CCL) substrate.

8. The image sensor package of claim 1, further comprising:
    a plurality of conductive components coupled to the conductive traces on the second surface of the second interposer, the plurality of conductive components configured to be connected to an external device.

9. The image sensor package of claim 8, wherein the plurality of conductive components includes solder ball members.

10. The image sensor package of claim 1, wherein the image sensor device includes a first surface and a second surface, the first surface of the image sensor device including an active region configured to receive light, the second surface of the image sensor device being coupled to at least one of the conductive traces on the first surface of the first interposer, the image sensor package further comprising:
    a lid member coupled to the first surface of the image sensor device via a bonding material such that an empty space exists between the active region of the image sensor device and the lid member.

11. The image sensor package of claim 1, further comprising:
    a molding material encapsulating the at least one conductive element; and
    a plurality of conductive vias that couple the first device to the first interposer.

12. An image sensor package comprising:
    a first interposer having a first surface and a second surface, the first interposer including conductive traces on the first and second surfaces;
    an image sensor device coupled to at least one of the conductive traces on the first surface of the first interposer, the first interposer being disposed outside of an outer structure of the image sensor device;

at least one conductive element coupled to the first interposer and the image sensor device;

a second interposer having a first surface and a second surface, the second interposer including conductive traces on the first and second surfaces of the second interposer;

a conductive via coupled to and between the first interposer and the second interposer;

a first device coupled to at least one of the conductive traces on the first surface of the second interposer; and a second device coupled to at least one of the conductive traces on the first surface of the second interposer.

13. The image sensor package of claim 12, wherein the first device is coupled to the first surface of the second interposer with a plurality of conductive bump members.

14. The image sensor package of claim 12, further comprising:

an insulation layer disposed between the first interposer and the second interposer, the insulation layer including a polymer-based material, the conductive via extending through the insulation layer.

15. The image sensor package of claim 12, further comprising:

a plurality of conductive components coupled to at least one of the conductive traces on the second surface of the second interposer, the plurality of conductive components configured to be connected to an external device.

16. The image sensor package of claim 12, wherein the image sensor device includes a first surface and a second surface, the first surface of the image sensor device including an active region configured to receive light, the second surface of the image sensor device being coupled to at least one of the conductive traces on the first surface of the first interposer, the image sensor package further comprising:

a lid member coupled to the first surface of the image sensor device via a bonding material such that an empty space exists between the active region of the image sensor device and the lid member.

17. A method of fabricating an image sensor package, the method comprising:

coupling a first device and a second device to a first surface of a first interposer, the first interposer including conductive traces on the first surface and a second surface of the first interposer;

disposing one or more insulation layers on the first surface of the first interposer and the first and second devices;

disposing a second interposer on the one or more insulation layers, the second interposer including conductive traces on first and second surfaces of the second interposer;

coupling an image sensor device to the second interposer, the first and second interposers being disposed outside of an outer structure of the image sensor device; and coupling at least one bond wire to the image sensor device and to the second interposer.

18. The method of claim 17, further comprising:

forming a conductive via between the first interposer and the second interposer.

19. A method of fabricating an image sensor package, the method comprising:

disposing at least one first insulation layer on a first surface of a first interposer, the first interposer including conductive traces on the first surface and a second surface of the first interposer;

disposing a first device on the at least one first insulation layer;

disposing at least one second insulation layer on the first device;

coupling a second interposer to the first device, the second interposer including conductive traces on first and second surfaces of the second interposer, the first and second interposers being disposed outside of an outer structure of an image sensor device;

coupling the image sensor device to the second interposer; and coupling at least one bond wire to the image sensor device and to the second interposer.

20. The method of claim 19, further comprising:

forming a conductive via between the first interposer and the second interposer.

21. The image sensor package of claim 1, wherein the first interposer and the second interposer include material of a same type.

22. The image sensor package of claim 1, wherein the first interposer includes an inner region and an outer region, the inner region directly contacting the image sensor device, the outer region not directly contacting the image sensor device, a portion of the outer region being coupled to the at least one conductive element.

23. The image sensor package of claim 1, wherein the at least one conductive element includes a conductive wire.

* * * * *